United States Patent
Bjorkman et al.

[11] Patent Number: 6,074,514
[45] Date of Patent: Jun. 13, 2000

[54] HIGH SELECTIVITY ETCH USING AN EXTERNAL PLASMA DISCHARGE

[75] Inventors: Claes Bjorkman, Mountain View; Hongching Shan, San Jose; Michael Welch, Livermore, all of Calif.

[73] Assignee: Applied Materials, Inc., Santa Clara, Calif.

[21] Appl. No.: 09/020,959

[22] Filed: Feb. 9, 1998

[51] Int. Cl.[7] .................................................... C23F 1/02
[52] U.S. Cl. ............ 156/345; 156/345 P; 156/345 MW; 156/345 C; 156/345 PC; 156/345 MC
[58] Field of Search ...................... 156/345 P, 345 MW, 156/345 C, 345 PC, 345 MC

[56] References Cited

U.S. PATENT DOCUMENTS

| | | |
|---|---|---|
| 4,859,908 | 8/1989 | Yoshida et al. . |
| 5,273,609 | 12/1993 | Moslehi . |
| 5,292,370 | 3/1994 | Tsai et al. . |
| 5,556,501 | 9/1996 | Collins et al. ........................... 156/345 |
| 5,702,530 | 12/1997 | Shan et al. ........................ 118/723 MP |
| 5,772,832 | 6/1998 | Collins et al. ........................... 156/345 |
| 5,888,414 | 3/1999 | Collins et al. .............................. 216/68 |

FOREIGN PATENT DOCUMENTS

| | | |
|---|---|---|
| 0 367 568 | 5/1990 | European Pat. Off. . |
| 0 451 943 A3 | 10/1991 | European Pat. Off. . |
| 0 488 393 A2 | 6/1992 | European Pat. Off. . |
| 0 522 296 A2 | 1/1993 | European Pat. Off. ......... H01J 37/32 |
| 2 614 041 | 4/1987 | France . |
| WO 86/06923 | 11/1986 | WIPO . |
| WO 92/1425 | 8/1992 | WIPO . |
| WO 96/15545 | 5/1996 | WIPO . |
| WO 99/01888 | 1/1999 | WIPO . |

OTHER PUBLICATIONS

Patent Abstracts of Japan, Publicction No. 04130628, Jan. 5, 1992 (Sanyo Electron Ltd).
Patent Abstracts of Japan, Publication No. 06084837, Mar. 15, 1994 (Mitsubishi Electric Corp).
Patent Abstracts of Japan, Publication No. 09092643, Apr. 4, 1997 (Sekine Makoto).
Patent Abstracts of Japan, Publication No. 58202533, Nov. 25, 1983 (Hitachi Ltd).
Patent Abstracts of Japan, Publication No. 59121747, Jul. 13, 1984 (Fujitsu Ltd).
Patent Abstracts of Japan, Publication No. 06280059, Apr. 10, 1994 (Kawasaki Heavy Ind Ltd).

*Primary Examiner*—Maria Nuzzolillo
*Assistant Examiner*—Angela J. Martin
*Attorney, Agent, or Firm*—Michaelson and Wallace

[57] ABSTRACT

An apparatus and method for scavenging etchant species from a plasma formed of etchant gas prior to the etchant gas entering a primary processing chamber of a plasma reactor. There is at least one scavenging chamber, each of which is connected at an inlet thereof to an etchant gas source and at an outlet thereof to a gas distribution device of the primary processing chamber. Each scavenging chamber has a radiation applicator that irradiates the interior of the scavenging chamber and creates a plasma therein from etchant gas flowing through the chamber from the etchant gas source to the gas distribution apparatus of the primary processing chamber. The applicator uses either an inductive discharge, capacitive discharge, direct current (DC) discharge or microwave discharge to irradiate the interior of the scavenging chamber and ignite the plasma. An etchant species scavenging source is also disposed within the scavenging chamber. This source provides scavenging material that interacts with the plasma to scavenge etchant species created by the dissociation of the etchant gas in the plasma and form etch by-products comprised of substances from both the etchant species and the scavenging source. The scavenging chambers can be employed, as is or in a modified form, as excitation chambers to excite gases at optimal conditions and feed the modified gases into the primary chamber. The scavenging chamber is modified by removing its scavenging source if this source would adversely interact with the gas being excited.

22 Claims, 4 Drawing Sheets

HIGH SELECTIVITY ETCH USING AN EXTERNAL PLASMA DISCHARGE

BACKGROUND

1. Technical Field

The invention is related to a plasma reactor for processing a workpiece such as a semiconductor wafer or insulating substrate wherein etch selectivity is enhanced by scavenging etchant species from the plasma, and more particularly to such a reactor wherein the scavenging process is conducted outside the processing chamber of the reactor.

2. Background Art

A plasma reactor may be employed to perform various processes on a semiconductor wafer in microelectronic fabrication. The wafer is placed inside a vacuum chamber of the reactor and process gases, including etchant gases, are introduced into the chamber. The gases are irradiated with electromagnetic energy to ignite and maintain a plasma. Depending upon the composition of the gases from which the plasma is formed, the plasma may be employed to etch a particular material from the wafer or may be employed to deposit a thin film layer of material onto the wafer.

An important factor associated with using a plasma reactor for etching is the etch selectivity. The term etch selectivity refers to the ratio of etch rates of two different materials on a workpiece undergoing etching in the plasma reactor. In one common scenario, it is desired that oxygen-containing materials on a workpiece be etched much faster than an overlying mask formed of photoresist or so-called hardmask material (e.g. $SiO_2$ or $Si_3N_4$).

Additionally, it is often desired that the oxygen-containing materials be etched much faster than non-oxygen-containing materials of the workpiece. These comparative etch rate relationships are referred to as a high oxide-to-mask and oxide-to-"nonoxide" selectivity, respectively. The desirability of this high selectivity will be explained using the example of etching a contact opening through a dielectric layer, such as silicon dioxide ($SiO_2$), to an underlying polysilicon conductor layer and/or to a silicon substrate of a semiconductor wafer. A layer of mask material is formed over the surface of the silicon dioxide layer prior to the etching process in those areas that are not to be etched. Accordingly, there is no mask formed in the area where the contact opening is to be etched. The desired result of the etching process is to quickly etch through the silicon dioxide layer where the contact opening is to be formed, but not to significantly etch the surrounding mask, or the polysilicon or silicon material (or other non-oxygen-containing material such as silicon nitride) underlying the silicon dioxide layer. Thus, high oxide-to-mask and oxide-to-silicon etch selectivities are desired. For a silicon oxide etch process, process gases including an etchant such as fluorine-containing gases are introduced into the chamber. The fluorine-containing gases freely dissociate under typical plasma conditions so much that not only is the silicon oxide layer etched but the mask and the eventually exposed underlying polysilicon or silicon materials are also etched to an unacceptable degree.

Thus, without taking steps to ameliorate the effect of excess fluorine-containing etchant species in the plasma on the mask and non-oxide layers of the wafer, a less than desirable etch selectivity results. In fact, if the selectivity is low enough a so-called "punch through" condition can result wherein the mask layer or a non-oxide layer is etched through causing damage to the device being formed on the wafer. Similar problems related to excess etchant species in the plasma occur in other etch processes as well. For example, polysilicon and silicide (gate) etch processes, or metal etch processes, are subject to degraded selectivity in the presence of excess etchant species.

One method of dealing with the excess of etchant species in the plasma is to introduce a substance that combines with some of the etchant species to form non-etching substances. This process is typically referred to as "scavenging". Ideally, just enough of the etchant species is scavenged from the plasma to increase the selectivity without reducing the etching rate of the material being etched to an unacceptable degree. For example, in the previously-described silicon dioxide etch process, fluorine etchant species are scavenged from the plasma typically by introducing silicon to form the non-etching by-product $SiF_4$. This silicon can be introduced as a component of a gas, or via a solid silicon-containing structure such as one containing pure silicon, polysilicon, silicon carbide (SiC), or a silicon-based dielectric. In the case where a solid silicon-containing source is employed, the source can form a part of the reactor chamber ceiling and/or walls, or it can be a separate piece held within the chamber. Typically, the temperature of the solid silicon-containing source is controlled to prevent it from being covered with deposits comprised of etch by-products or a polymer film (as will be more fully discussed later), and additionally to permit silicon to be more easily removed from the source by the plasma in desired quantities. An RF bias potential is also often applied to a solid silicon-containing source in conjunction with controlling the temperature for the same reasons.

However, in some etching processes the selectivity cannot be increased to satisfactory levels without unacceptably reducing the etch rate of the material being etched from the workpiece. In these situations it is known to introduce a substance into the plasma which causes a protective, etch-resistant layer to deposit on the workpiece materials that are not to be etched, while not depositing on the material to be etch to any significant degree. For example, in the aforementioned silicon dioxide etch process, it is known that the oxide-to-mask and oxide-to-silicon etch selectivity is enhanced by a polymer film that forms more readily over the mask, silicon, polysilicon, and other non-oxygen-containing layers than over silicon dioxide (or other oxygen-containing materials). The polymer resists etching by the fluorine etchant species, thereby increasing the aforementioned selectivity. One common method of forming such a selectivity-enhancing polymer film is to employ a fluorocarbon or fluoro-hydrocarbon gas (e.g., ethyl hexafluoride ($C_2F_6$) or trifluoromethane ($CHF_3$)) as the fluorine-containing portion of the process gas. Some of the fluorine-containing species in the plasma are consumed in etching the silicon dioxide layer on the wafer. Other species form a polymer layer on the surface of the wafer. This polymer forms more rapidly and strongly on any exposed non-oxygen-containing surface, such as the mask, silicon or polysilicon surfaces, than on the oxygen-containing surfaces such as the silicon dioxide. In this way the non-oxygen-containing surfaces are protected from the action of the fluorine etching species and the etch selectivity for those surfaces is enhanced. The etch resistance of the polymer can be further strengthened by increasing the proportion of carbon in the polymer relative to fluorine. Typically, the previously-described fluorine scavenging process is employed to reduce the amount of free fluorine in the plasma, thereby resulting in an increase in the carbon content of the polymer.

It is evident from the foregoing description that the scavenging process plays key role in producing a desired etch selectivity in most plasma-enhanced etching processes, including those relying on the formation of a protective film such as the carbon-fluorine polymer employed in silicon oxide etch procedures. However, current etchant species scavenging processes have drawbacks. For example, in the case of a solid silicon scavenging source, one problem is that the rate of removal of silicon from the source required to achieve the necessary decrease in the free fluorine etchant species population of the plasma is so great that the source is rapidly consumed and the consequent need to idle the plasma reactor to replace the source exacts a price in loss of productivity and increase costs. In addition, the size of a modern plasma reactor chamber dictates that the solid silicon source, whether it be integrated into the ceiling and/or walls of the chamber, or a separate piece supported within the chamber, be relatively large so that the scavenging process is uniform across the width of the plasma. This presents a problem as it is difficult to manufacture and control the purity of large silicon structures. As a result, these structures are expensive. Further, this problem is likely to become even worse in view of the current trend to increase the size of the reactor chamber to accommodate ever larger workpieces. The larger reactor chambers will require even bigger silicon sources with a corresponding increase in price.

Another problem with current scavenging processes concerns the devices required to control the temperature of a solid scavenging material source. Typically, the temperature control devices are integrated with the source to reduce the time it takes to change its temperature, thereby ensuring the temperature can be carefully controlled throughout the etch process. This need to integrate portions of the temperature control device into the source itself complicates the structure further, thereby making it even more difficult to manufacture and more expensive. In addition, the larger the source, the more elaborate the temperature control device has to be in order to ensure a precise control of the source's temperature. Given the aforementioned trend toward up-sizing the reactor chambers, the cost of these consumable scavenging sources may become exorbitant.

An even greater problem with current scavenging processes is that the process parameters, such as the RF power level or chamber temperature, which lead to optimizing etching of the workpiece are not typically those that will maximize selectivity. For example, it is known that increasing the RF power input into the chamber can boost the etch rate. However, this same increase in power also tends to increase the concentration of free etchant species in the plasma which can lead to an undesirable lowering of the oxideto-mask or oxide-to-nonoxide selectivity. Thus, there is an troublesome tradeoff between the etch rate and selectivity.

Accordingly, there is a need for a plasma reactor design and method of scavenging etchant species from the plasma that does not require the use of large, expensive, scavenging source structures within the reactor's processing chamber which require costly and frequent replacement. Further, there is a need for such a reactor design and scavenging method that decouples the control of etch selectivity from the control of etch performance, thereby eliminating the undesirable tradeoff between these etch process factors.

SUMMARY

The stated needs are fulfilled by an apparatus and method for scavenging etchant species from a plasma formed of etchant gas in a separate scavenging chamber prior to the etchant gas being introduced into the primary processing chamber of the reactor. Scavenging etchant species from the etchant gas prior to feeding it into the primary chamber "loads" the gas with relatively stable, non-etching, etch by-products formed in part from what would have otherwise become etchant species in the plasma created within the primary processing chamber and in part from the material used as a scavenging source in the scavenging chamber. In this way, the concentration of etchant species in the plasma of the primary processing chamber is reduced and the concentration of etch by-products in the plasma is increased, ideally to levels that maximize the oxide-to-mask and oxide-to-nonoxide etch selectivity of the etch process being performed in the reactor. The net result of this method of scavenging etchant species is to eliminate the need for any type of scavenging source structure inside the primary processing chamber of the reactor. Thus, the expense of these large primary chamber scavenging source structures is avoided, as is the cost associated with opening the primary chamber to replace the source.

The preferred apparatus is a plasma reactor that in addition to its primary processing chamber includes at least one scavenging chamber. Each scavenging chamber is connected at an inlet thereof to an etchant gas source and at an outlet thereof to a gas distribution device of the primary processing chamber. Each scavenging chamber has a radiation applicator capable of irradiating the interior of the scavenging chamber and creating a plasma from etchant gas flowing therethrough from the etchant gas source to the gas distribution apparatus of the primary processing chamber. The applicator can be of the type that uses either an inductive discharge, capacitive discharge, or microwave discharge to irradiate the interior of the scavenging chamber and ignite the plasma. An etchant species scavenging source is also included within the scavenging chamber. This source is capable of providing scavenging material that interacts with the plasma to scavenge etchant species created by the dissociation of the etchant gas in the plasma to form non-etching by-products comprised of substances from both the etchant species and the scavenging source.

The etchant species scavenging source is made of a material that will modify the etchant gas in a way that decreases the etch rate of a target material of a workpiece undergoing etch processing in the primary processing chamber of the plasma reactor, thereby increasing the selectivity for the target material. For example, the scavenging source material would preferably be of a type that scavenges the kind of etchant species from the plasma formed within the scavenging chamber and produces the kind of etch by-products that results in the aforementioned lowering of the etch rate of the target material during processing. If practical, the scavenging source could be made of the target material itself to obtain the desired results.

The etchant species scavenging source is also preferably solid and at least partially made of a solid scavenging material. If so, it is also preferred that the scavenging chamber have a removable lid covering an access opening in the chamber. The scavenging source is sized so as to facilitate its being installed into or removed from the chamber through the access opening. Additionally, if the source material is of a type that is expensive and difficult to form into relatively large structures, it is preferred that the source be as small as possible while still being capable of scavenging sufficient etchant species to create a desired concentration of etchant species and etchant by-products in the plasma formed within the primary processing chamber. The power applied to the radiation applicator can be increased and/or the flow rate of the etchant gas through the scavenging chamber can be decreased in order to increase the scavenging capability of the scavenging source, thereby allowing a smaller source to be used in the chamber. A solid source can also incorporate a temperature control apparatus if desired. The temperature control apparatus is capable of controlling the temperature of the scavenging source. Controlling the source temperature provides yet another way of ensuring the scavenging of sufficient etchant species to create a desired concentration of etchant species and etchant by-products in the plasma.

The amount of scavenging, and so the selectivity exhibited in the primary processing chamber, can further be actively controlled via the aforementioned methods. Namely, the power input to the scavenging chamber via the radiation applicator can be adjusted to control the amount of scavenging in the etchant gas flowing through the scavenging chamber.

Likewise, the flow rate of the etchant gas through the scavenging chamber can be adjusted to control the scavenging. And finally, the temperature of the scavenging source can be adjusted (if a temperature control apparatus is incorporated) to control the amount of scavenging. It is noted that the above-described control methods allow the selectivity exhibited during etch processing in the primary chamber to be for the most part independently determined regardless of the processing parameters employed in the primary chamber to optimize etch performance. The selectivity-determining scavenging has already occurred before the etchant gas even reaches the primary chamber. Thus, the control of selectivity has truly been decoupled from the control of etch performance using the methods of the present invention, and so the aforementioned tradeoff eliminated.

Alternately, the etchant species scavenging source can be a gaseous scavenging material introduced into the scavenging chamber. Preferably, the gaseous scavenging material would be introduced in a sufficient quantity to create a desired concentration of etchant species and etchant by-products in a plasma formed within the primary processing chamber.

As stated previously, there is at least one scavenging chamber connected to the primary processing chamber of the plasma reactor in accordance with the present invention. However, employing multiple scavenging chamber can be particularly advantageous. For example, it is often desired to increase the selectivity to more than one material on the workpiece. These separate materials may require that a different etchant species to be scavenged and/or different etching by-products to be loaded into the etchant gas in order to optimize the selectivity. If so, employing multiple scavenging chambers will allow for a separate tailoring of the selectivity of the materials. Essentially, the scavenging material of the source disposed in each scavenging chamber is chosen to scavenge the type of etchant species and produce the type of etch by-product necessary to create the desired selectivity for a particular material of interest on the workpiece. If two such materials are of interest, two scavenging chambers are employed. If it is desired to increase the selectivity for three such materials on the workpiece, three scavenging chambers are employed, and so on.

Further, the above-described scavenging chambers can be employed, as is or in a modified form, as excitation chambers to solve another problem typical of etch processing in a plasma reactor. The process parameters promoting optimal etch conditions (such as a fast etch rate) within the primary processing chamber are also not necessarily conducive to optimizing certain other process factors, exclusive of selectivity. For example, inert gases such as argon (Ar) and helium (He) are often excited in the plasma of the primary processing chamber of a plasma reactor for advantageous effect. However, the process parameters that promote optimal etch performance in the primary chamber, such as the RF power level, are not always conducive to effectively excite these inert gas components of the processing gas. The problem can be resolved by employing a separate excitation chamber outside of the primary processing chamber that excites gases at optimal conditions and feeds the modified gases into the primary chamber. The previously described scavenging chamber can readily act as such an excitation chamber, the only caveat being that the scavenging source may adversely interact with the gas being excited in some cases. However, as the source is removable from the scavenging chamber, it can simply be removed if such an adverse interaction would occur. Alternatively, one or more dedicated excitation chambers, identical to the previously described scavenging chamber but not capable of supporting a scavenging source, could be incorporated into the reactor, if desired.

In addition to the just described benefits, other objectives and advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

In the following description of the preferred embodiments of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

Figure 1:
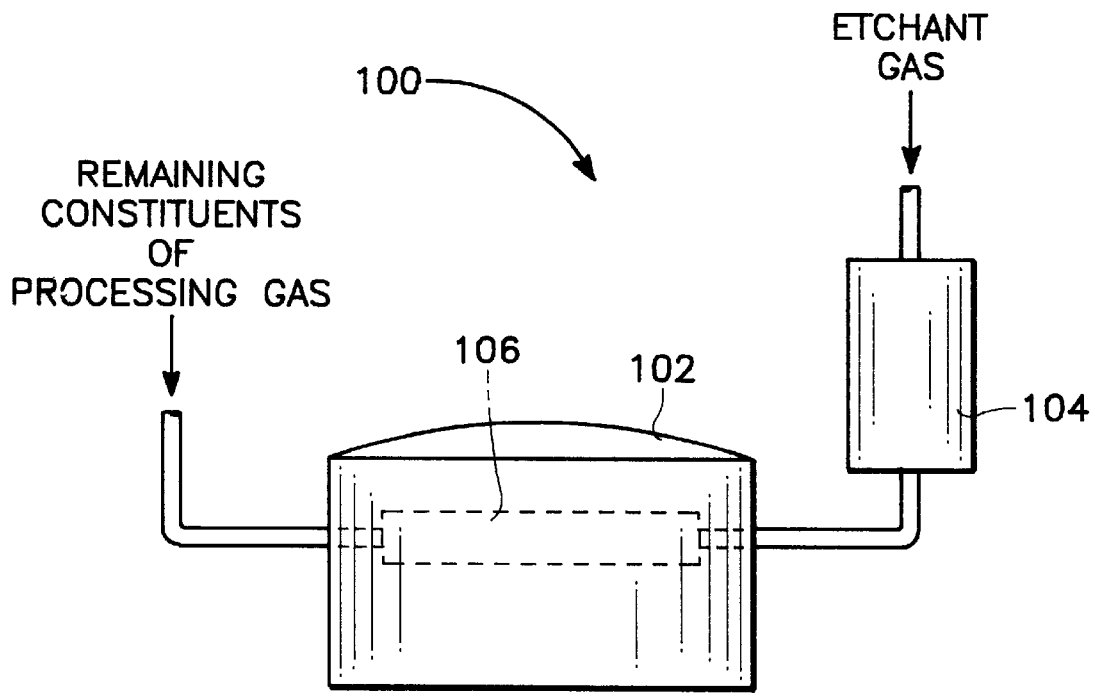
FIG. 1 is a schematic diagram of a plasma reactor incorporating a separate scavenging chamber in accordance with the present invention.

The proposed scavenging of etchant species from the etchant gas prior to it reaching the primary processing chamber 102 of the reactor 100 according to the present invention is accomplished by incorporating a scavenging chamber 104 into the reactor, as depicted in FIG. 1. This scavenging chamber 104 is located outside the primary processing chamber 102 of the reactor. The etchant or reactive gas which would have been a part of the processing gas heretofore fed directly into the primary processing chamber 102 of the reactor is instead first fed through the scavenging chamber 104. In the embodiment of the present invention depicted here, the remaining constituents of the processing gas are fed into the primary processing chamber 102 in the normal manner. A plasma is formed within the scavenging chamber 104 from the etchant gas as it flows through this chamber. The etchant gas disassociates within the plasma to form, among other things, etchant gas species. A scavenging material source (not shown) included in the scavenging chamber 104 is positioned so as to react with the plasma. The interaction of the plasma and the scavenging material source reduces the concentration of free etchant gas species to the desired level and creates by-products having components from both the etchant species and the source. The now modified etchant gas flows out of the scavenging chamber 104 and into the primary processing chamber 102 where it mixes with the other constituents of the processing gas. This mixing can occur within the primary chamber itself or preferably in the manifold of a conventional gas distribution apparatus 106 capable of feeding the combined gases into the primary chamber.

A prime advantage of performing etchant species scavenging outside of the primary processing chamber is to allow the control of etch selectivity to be decoupled from the control of etch performance. As discussed previously, current scavenging processes employing a solid scavenging material source resident within the primary processing chamber are detrimentally affected by attempts to optimize etch performance. Setting certain process parameters, such as the RF power level or chamber temperature, to levels that benefit etching performance, such as by increasing the etch rate, can simultaneously increase the concentration of free etchant species in the plasma. This increase in the concentration of etchant species leads to an undesirable lowering of the oxide-to-mask or oxide-to-nonoxide selectivity.

However, removing the selectivity-controlling scavenging process from the primary process chamber and instead performing it in a separate scavenging chamber allows the selectivity to be manipulated independent of etch performance. Process parameters conducive to optimum selectivity can be imposed in the scavenging chamber. Specifically, process parameters such as power input and temperature can be set to reduce the concentration of available etchant species in the scavenged etchant gases to a level that results in a maximum reduction in the etch rate of the particular material desired to have an increased selectivity. In addition to the reduction of available etchant species, this optimized scavenging process will introduce or "load" etch by-products into the modified etchant gas. These etch by-products are capable of inhibiting the diffusion of similar by-products away from the surface of the workpiece undergoing etching in the primary processing chamber. It is known that the presence of etching by-products at the surface of a workpiece will inhibit etching of the material associated with those by-products. Thus, selectivity is increased via this phenomenon as well.

Meanwhile, the process parameters tending to optimize etch performance can be imposed in the primary processing chamber without having to also consider the impact on selectivity. For the most part the advantageous changes made to the etchant gases in the scavenging chamber, namely a reduction of the available etchant species to desired levels and the introduction of beneficial etch by-products, will not be undone in the plasma of the primary processing chamber. Thus, for example, the power input to the primary chamber can be set to maximize the etch rate of the material being etched from the workpiece (e.g. silicon dioxide) without concern for also increasing the etch rate of materials not intended to be etched from the workpiece (e.g. mask and non-oxide layers of the workpiece). Granted, if the power level inside the primary chamber is extremely high, some of the etch by-products may be broken down to produce free etchant species. However, if this is the case, it would be possible to compensate for this release of etchant species by using the scavenging chamber to "overscavenge", thereby resulting in a net free etchant species concentration in the primary chamber of the desired level.

Another significant advantage of conducting the scavenging process outside of the primary processing chamber is that there is no longer a need to prevent deposition of etch by-products or etch resistant materials (such as the polymer created in a silicon dioxide etch process) on the chamber's interior surfaces. In the past, such depositions had to be avoided in order to keep the solid scavenging material source form being covered, thereby becoming non-reactive with the plasma. However, since the scavenging material source is now resident in the scavenging chamber there is no need to completely prevent the depositions on the surfaces of the primary process chamber. In fact, some amount of deposition on the chamber surfaces has a beneficial effect that could not heretofore been realized. Specifically, these deposits tend to trap "harmful" particles that could otherwise have found their way to the surface of the workpiece where they could damage or destroy the devices being formed thereon. Granted, some control of the amount of deposition may still have to be maintained. For example, in the case of the polymer formed in the plasma of an etch process designed to etch silicon dioxide from a silicon wafer, there must not be so much deposition of the polymer on the chamber surfaces that there is not enough left to adequately protect the mask and non-oxide layers of the wafer. Regardless, it is much easier to simply control the amount of deposits on the chamber surfaces, than it is to completely prevent them.

Figure 2A:
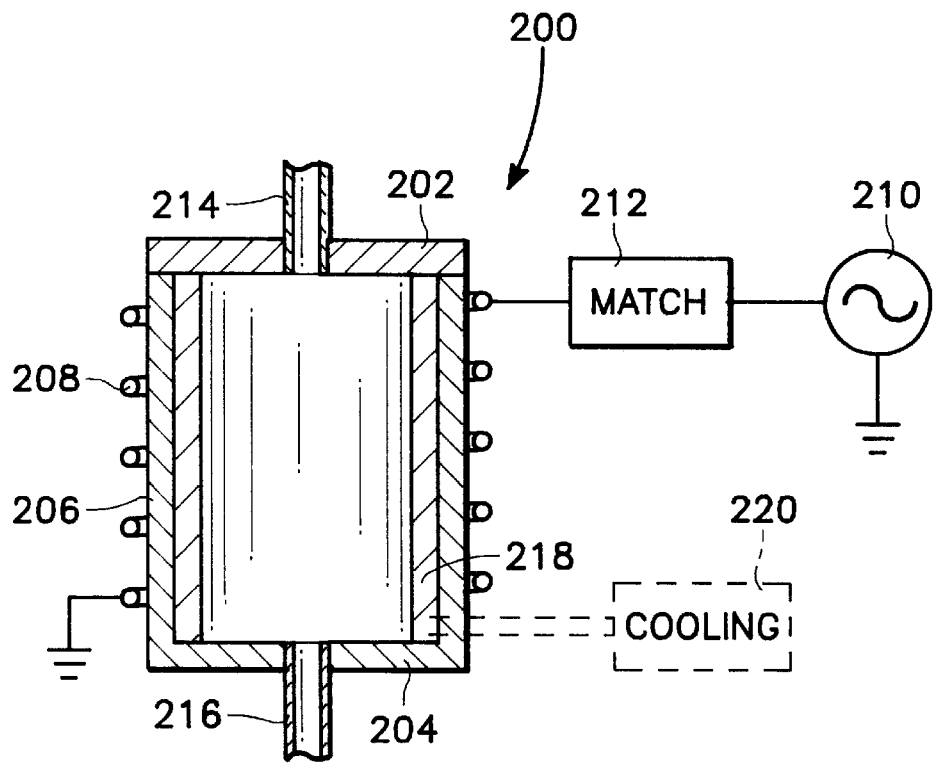
FIG. 2A is a cross-sectional, side view of the scavenging chamber of FIG. 1 employing an inductive power applicator and an internal scavenging liner.

An inductive, capacitive or microwave discharge is preferably used to create the plasma in the scavenging chamber. FIG. 2A illustrates an embodiment of a scavenging chamber 200 configured to create a plasma using an inductive discharge. The chamber 200 has disk-shaped lid 202 and bottom 204, and a cylindrical side wall 206. An inductive coil antenna 208 is wound around the side wall of the chamber 200 and connected to a radio frequency (RF) plasma source power generator 210 through an impedance match circuit 212 to provide RF power into the chamber. Preferably, the side wall 206 is made of a dielectric or semi-conductor material so as to not significantly inhibit the transfer of RF energy into the chamber. The lid 202 and bottom 204 of the chamber can be made of any appropriate material, including a dielectric or semi-conductor material, or even a metal such as aluminum or stainless steel. The above-described chamber structure is meant as an example only. Many other chamber shapes are equally viable. For example, the scavenging chamber could have a domed-shaped top portion similar to the primary processing chambers of many commercially available plasma reactors. The coil antenna in such a dome-shaped reactor could surround all or a portion of the dome-shaped top portion. Essentially, any chamber configuration known to be employed for the primary processing chamber of a plasma reactor could also be used in constructing the scavenging chamber associated with the present invention.

Etchant gas is introduced into the scavenging chamber 200 via an inlet line 214 that originates at a conventional etchant gas source (not shown). The etchant gas is modified inside the chamber as will be discussed later and this modified gas exits the scavenging chamber 200 via an outlet line 216. The outlet line 216 is connected to an inlet of the primary processing chamber, as described previously.

A hollow, cylindrical liner 218 is disposed within the chamber 200. This liner 218 is formed at least in part of a scavenging material and constitutes the aforementioned scavenging material source. Preferably, the liner 218 is sized such that it slides into the chamber 200 with the lid 202 removed, and its exterior surface abuts against the interior surface of the chamber's side wall 206. This liner configuration allow for easy installation and removal to facilitate its replacement once the scavenging material has been consumed. It is noted that a key advantage of the external scavenging chamber concept is that the consumable solid scavenging material source can be quickly and easily replaced without having to open the primary processing chamber. Opening the primary processing chamber is time-consuming and often quite a complex operation. In addition, opening the primary processing chamber risks the introduction of contaminants into the chamber and/or disturbing deposits that have formed on the interior surfaces of the chamber. Contaminants and loose deposit material can adversely affect processing conditions within the chamber, or could fall onto a workpiece being processed and cause damage to the devices being formed thereon. Thus, eliminating the need to open the primary processing chamber to replace the scavenging source is quite desirable.

The size of the scavenging chamber 200 is primarily dictated by the size of the liner 218, and the liner 218 can be of any size desired. However, there are some factors to be considered. First, the area of the interior surface of the liner 218 should be made large enough to ensure its reaction with the plasma is sufficient to reduce the concentration of free etchant species to the desired level, given a particular RF power level input to the coil antenna 208 and a particular flow rate of the etchant gas through the chamber 200. However, as discussed previously, some types of solid scavenging material sources (e.g. silicon) become more difficult to manufacture and more expensive as they become larger. Therefore, an opportunity exists to reduce the cost of the scavenging material source by making it smaller. Increasing the RF power input or slowing the flow rate of the etchant gas could be explored as possible ways to achieve the desired scavenging effect while still employing a relatively small source. It is noted that smaller sources will require more frequent replacement. However, given the easy replacement characteristics of the proposed scavenging chamber 200, it is believed the overall cost would still be less than employing larger sources.

It is also possible to modify the scavenging chamber 200 and liner 218 to accommodate an optional temperature control apparatus 220 (shown in dashed lines in FIG. 2A) used to control the temperature of the liner 218. This optional temperature control apparatus could be any appropriate type currently used for the same purpose in existing schemes for controlling the temperature of a solid scavenging material source within the primary processing chamber of a plasma reactor. The addition of such a temperature control apparatus would provide yet another way to control the scavenging process in the scavenging chamber 200, albeit at an increased cost.

While the liner has been described as being cylindrical in shape, this is done by way of an example only. The liner may take on other shapes as desired. In addition, the inner surface of the liner need not be smooth cylindrical wall and need not match the shape of the external surface of the liner. For example, the inner wall of the liner could advantageously be made up of a series of longitudinal ribs projecting into the hollow interior of the liner and spaced periodically around the circumference of the wall. Such a configuration would increase the surface area of the inner surface of the liner over that of a simple cylindrical wall. The increased surface area would result in a greater interaction between the liner and the plasma formed therein, thereby increasing the scavenging effect.

In the background section of the this patent specification an example of a particular scavenging process was provided that involved the etching of a silicon oxide layer to an underlying polysilicon conductor layer and/or to a silicon substrate of a semiconductor wafer using fluorine-containing etchant species. The solid scavenging source employed in this process was made of silicon or silicon-containing materials such as silicon carbide (SiC) or a silicon-based dielectric. However, other plasma-enhanced etch processes using different etching chemistries can also benefit from the present invention. Generally, any plasma etching process that employs etchant species scavenging to control selectivity is a candidate. Generally, to increase selectivity to a particular material (i.e. lower the etch rate of the material in comparison to other materials present on a workpiece), this material is used to form the liner of the scavenging chamber. In operation, the concentration of the particular etchant species in a plasma formed from the etchant gas will be reduced and the etchant gas will be "loaded" with the previously-discussed beneficial etching by-products attributable to the reaction between the particular material and the etchant species. The combination of the reduced concentration of etchant species in the plasma and the presence of etching by-products results in an increase in the selectivity to the material used to form the liner of the scavenging chamber.

Further, if it would be difficult or expensive to form the liner of the particular material for which it is desired to increase the etch selectivity, a related material that scavenges the same etchant species and creates the same etch by-products (or similar etch by-products having the same inhibiting effect) can be used as a substitute. The use of a substitute liner material would also provide a distinct advantage if it is known to more effectively scavenge the etchant species of interest or produce more of the desired etch inhibiting etch by-products. An example of etch processes and chemistries other than the previously-described silicon oxide etch scenario include a polysilicon and silicide (gate) etch process employing chlorine ($Cl_2$) and/or hydrogen bromide (HBr) based etchant gases. This process require high selectivity to the overlying mask layer and a very thin, underlying gate oxide layer (e.g. 40–100 Angstoms of $SiO_2$). Another example is a metal etch process where a high selectivity to the overlying mask is required. In both of these examples, excess concentrations of etchant species in the plasma can detrimentally affect the desired high selectivity.

Figure 2B:
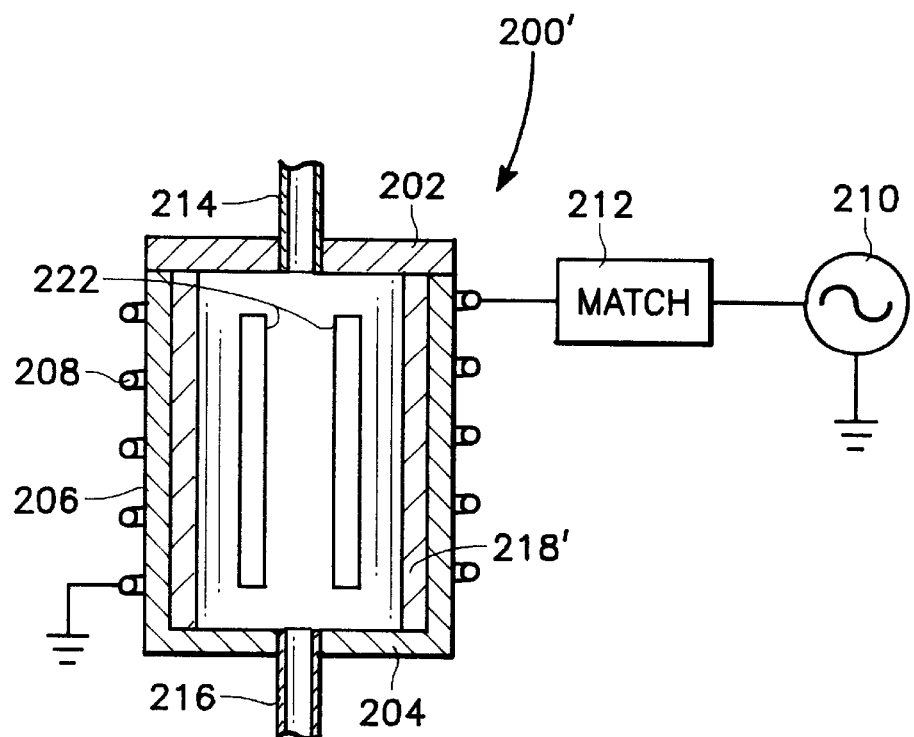
FIG. 2B is a partially cut-away, side view of the scavenging chamber of FIG. 2A wherein the internal scavenging liner is made of a conductive material and slotted to admit RF power into the interior of the chamber.

In the case where the material for which it is desired to increase selectivity is electrically conductive, the liner of the scavenging chamber will have to be modified to ensure sufficient RF energy reaches the interior of the chamber to ignite and maintain a plasma. As shown in FIG. 2B, the scavenging chamber 200' has been modified to include a slotted liner 218'. Specifically, the modified liner 218' has longitudinally-oriented rectangular slots 222 spaced periodically around the liner's circumference, preferably at equal distances. The number and size of the slots 222 is chosen to ensure a transfer of RF energy into the interior of the chamber 200' from the coil antenna 208 sufficient to both ignite and maintain a plasma. It is noted, however, that although longitudinally-oriented rectangular slots are shown, other slot shapes can be employed without deviating from the scope of the present invention. The only critical requirement is that sufficient RF energy be transmitted through the liner 218' to the interior of the chamber 200'.

Figure 3A:
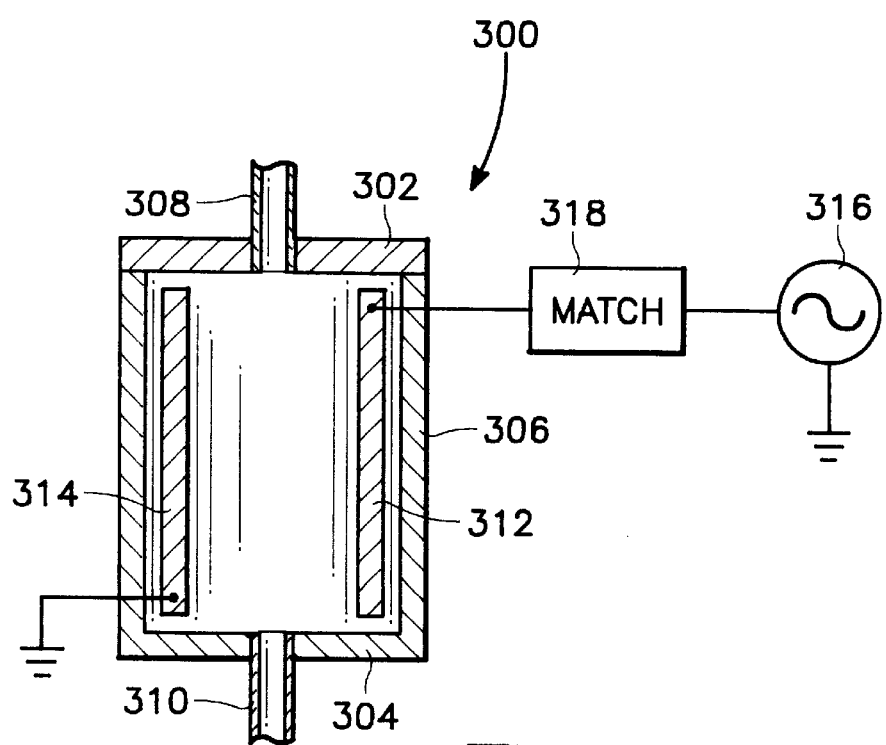
FIG. 3A is a cross-sectional, side view of the scavenging chamber of FIG. 1 employing a capacitive power applicator comprising a pair of oppositely facing internal electrodes made of a scavenging material.

FIG. 3A illustrates an embodiment of a scavenging chamber 300 configured to create a plasma using a capacitive discharge. The external parts of the chamber 300 are similar to those of the chamber of FIGS. 2A and 2B in that there is a disk-shaped lid 302 and bottom 304, and a cylindrical side wall 306. Here again, etchant gas is introduced into the scavenging chamber 300 via an inlet line 308 that originates at a conventional etchant gas source (not shown). The etchant gas once modified in the chamber 300 exits via an outlet line 310, which is connected to an inlet of the primary processing chamber.

The scavenging chamber 300 differs from the previously-described inductive discharge embodiment in that the inductive coil antenna is replaced by a pair of electrodes 312, 314. In a first version of the capacitive discharge embodiment shown in FIG. 3A, these electrodes 312, 314 are resident within the chamber 300 and face each other from opposite sides so as to form a plasma formation region therebetween. One or both of the electrodes 312, 314 can constitute the solid scavenging material source of the chamber if at least one is made of the desired scavenging material. The electrodes 312, 314 are also electrically connected to opposite sides of a plasma source power generator 316. In the case depicted in FIG. 3A, the first electrode 312 is connected to the active side of the generator 316 through an impedance match circuit 318 and the second electrode 314 is connected to the ground side of the generator. These connections can be reversed if desired. Since the electrodes 312, 314 are resident within the chamber 300, the lid 302, bottom 304 and side wall 306 can be made of any appropriate material including a dielectric or semi-conductor material, or a metal such as aluminum or stainless steel.

As with the previous embodiments, the electrodes 312, 314 are designed to slide easily into and out of the chamber 300 when the lid 302 is removed, thereby facilitating replacement of the consumed scavenging material source. This will preferably entail the use of an appropriate securing structure (not shown) within the chamber 300, as well as quick disconnect-type electrical connections. As a vast number of different securing arrangements can be employed and do not form a novel part of the present invention, no further details will be provided herein.

The size of the electrodes 312, 314 can be of any desired, however, the aforementioned design factors apply here as well. Specifically, the area of the surfaces of the electrodes 312, 314 that react with the plasma should be made large enough to ensure the concentration of free etchant species is reduced to the desired level, given a particular RF power level input and a particular flow rate of the etchant gas through the chamber 300. However, as some types of solid scavenging material sources, like one made from silicon, are more difficult to manufacture and more expensive as they become larger, it would be preferable to make the electrodes 312, 314 relatively small. The key is to make the electrodes as small as possible, but still able to provide the desired scavenging effect at a reasonable RF power input level, a reasonable etchant gas flow rate and a reasonable replacement frequency.

One or both of the electrodes 312, 314 can also be modified like the liner of FIGS. 2A and 2B to accommodate a temperature control apparatus (not shown). Here again, this optional temperature control apparatus would provide yet another way to control the scavenging process.

Figure 3B:
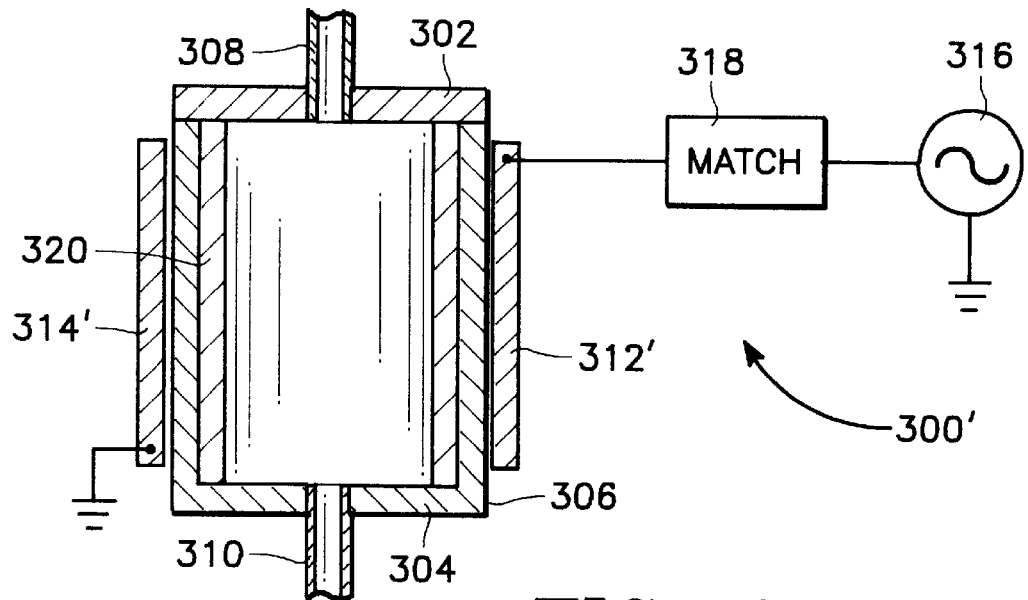
FIG. 3B is a partially cut-away, side view of the scavenging chamber of FIG. 1 employing a capacitive power applicator comprising a pair of oppositely facing external electrodes and an internal scavenging liner.

In an alternative version of the capacitive discharge embodiment shown in FIG. 3B, the electrodes 312', 314' are placed outside the side wall 306 of the chamber 300' on opposite sides thereof so as to face each other and form a plasma formation region inside the chamber. In this version the electrodes 312', 314' can be made of any appropriate conductive material, and are connected to the plasma source power generator 316 in the same way as the previous version of this embodiment shown in FIG. 3A. However, because the electrodes 312', 314' are outside the side wall 306 of the chamber, the side wall is made of a dielectric or semi-conductor material so as to not significantly inhibit the transfer of RF energy into the chamber. The lid 302 and bottom 304 of the chamber can be made of any appropriate material, including a dielectric or semi-conductor material, or a metal such as aluminum or stainless steel. This version of the capacitive discharge embodiment is particularly useful where the scavenging material is not conductive and so inappropriate for use as an electrode.

The solid scavenging material source in the version of the capacitive discharge embodiment shown in FIG. 3B is preferably the same as that employed in the inductive discharge embodiment of FIGS. 2A and 2B, namely a hollow, cylindrical liner 320 formed of the desired scavenging material. Additionally, the same design factors concerning size, ease of replacement and optional temperature control apply the liner 320, as well.

The embodiment of FIG. 3A could also be advantageously modified to create a scavenging chamber configured to create a plasma using a direct current (DC) discharge. This can be accomplished by replacing the RF power generator with a DC source (not shown) and making the electrodes from a conductive material. If the desired scavenging material is not conductive and cannot be used to form one or both of the electrodes, then the solid scavenging material source would preferably be the aforementioned hollow, cylindrical liner. Here again, the previously-described design factors concerning size, ease of replacement and optional temperature control of the scavenging material source apply to this DC discharge embodiment as well.

Figure 4:
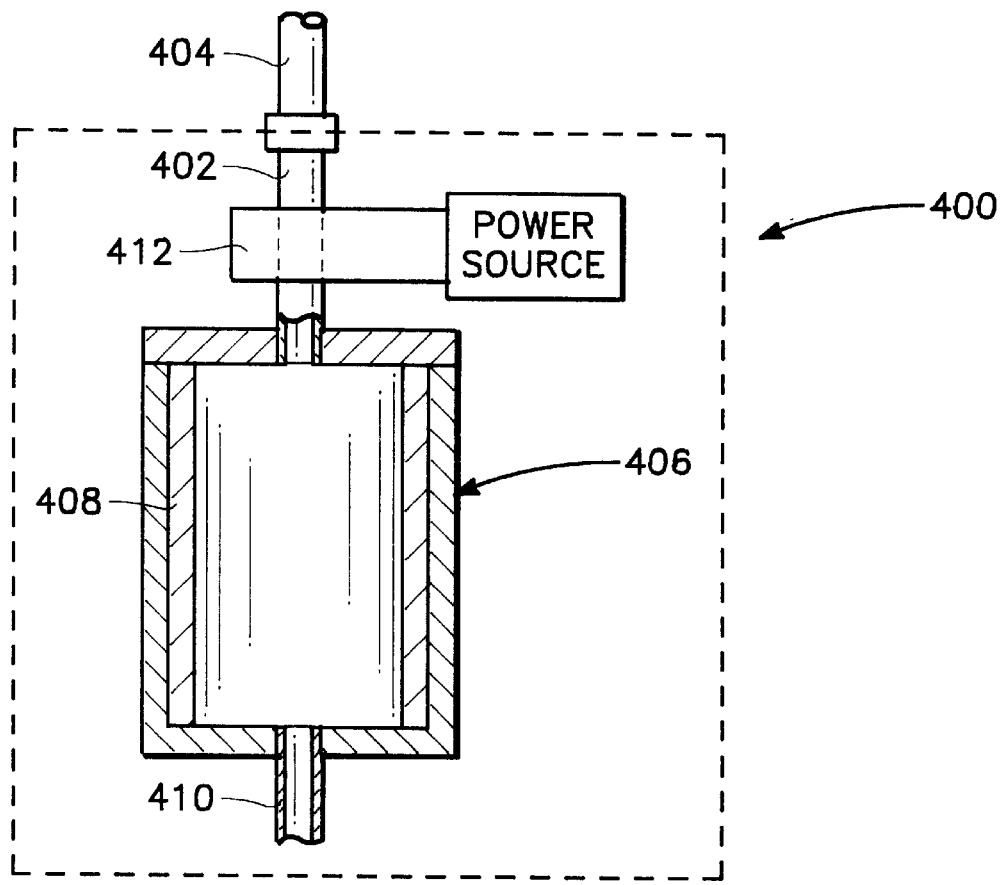
FIG. 4 is a partially cut-away, side view of the scavenging chamber of FIG. 1 employing a microwave source power applicator and a scavenging liner chamber.

FIG. 4 illustrates an embodiment of a scavenging chamber 400 configured to create a plasma using a microwave discharge. In this embodiment, the scavenging chamber 400 includes an applicator tube 402, preferably made of a dielectric material such as sapphire. The applicator tube 402 is connected at one end to an etchant gas source (not shown) via an appropriate inlet feed line 404, and at the other end to the inlet of a liner chamber 406. The liner chamber 406 is nearly identical to the chamber 200 of FIG. 2A and shares the similar design attributes and advantages. This includes having a liner 408 that is identical to the liner 218 of FIG.

2A or any of its previously-described variations. The liner 408 constitutes the solid scavenging material source of the scavenging chamber 400 of this embodiment. However, in this case the liner 408 can be made of any scavenging material including materials that are conductive because there is no need to couple RF power through it. The outlet of the liner chamber 406 is attached to an appropriate outlet feed line 410, which is in turn connected to an inlet of the primary processing chamber of the plasma reactor. The applicator tube 402 passes through a microwave waveguide 412 at a point in-between the inlet feed line 404 and the liner chamber 406. The microwave power is coupled via the waveguide 412, thus creating a plasma inside the applicator tube 402 from the etchant gas passing through on its way to the primary processing chamber. A similar microwave discharge scheme was disclosed in a co-pending application, except that the referred to application included multiple applicator tubes whereas just one is preferably employed in this microwave discharge embodiment of the present invention. The copending application is entitled DISTRIBUTED MICROWAVE PLASMA REACTOR FOR SEMICONDUCTOR PROCESSING and has some of the same inventors as the present application, and is assigned to a common assignee. This application was filed on Jun. 23, 1995 and assigned Ser. No. 08/494,297. The disclosure of the co-pending application is herein incorporated by reference.

The etchant species generated by the plasma within the applicator tube 402 will exhibit a relatively high energy in comparison to such species generated within an inductive or capacitive discharge-created plasma. This high energy dictates placing the liner 408 downstream of the microwave source 412. For example, if a microwave discharge-created plasma were created within or adjacent to the liner 408 itself, the plasma energy would be so high that the etchant gas would be over-scavenged of etchant species. However, the etchant gas loses energy as it flows down the applicator tube 402, therefore the liner chamber 406 is preferably located at a distance away from the microwave source 412 that roughly coincides with an expected plasma energy range capable of creating the desired scavenging effect. This placement of the liner chamber 406 alone is not relied upon to control the precise concentration of etchant species scavenged from the etchant gas as it flows through the scavenging chamber 400. Rather, other control methods are also employed. For example, as with all the embodiments of the present invention the power input to the plasma generating apparatus, which in this case is a microwave source, can be varied to control the scavenging effect. Additionally, the flow rate of etchant gas through the scavenging chamber 400 could be varied to assist in creating the desired scavenging effect. The previously-described temperature control apparatus can also be incorporated into the liner 408 to provide a further control of the concentration of etchant species scavenged from the etchant gas.

Figure 5:
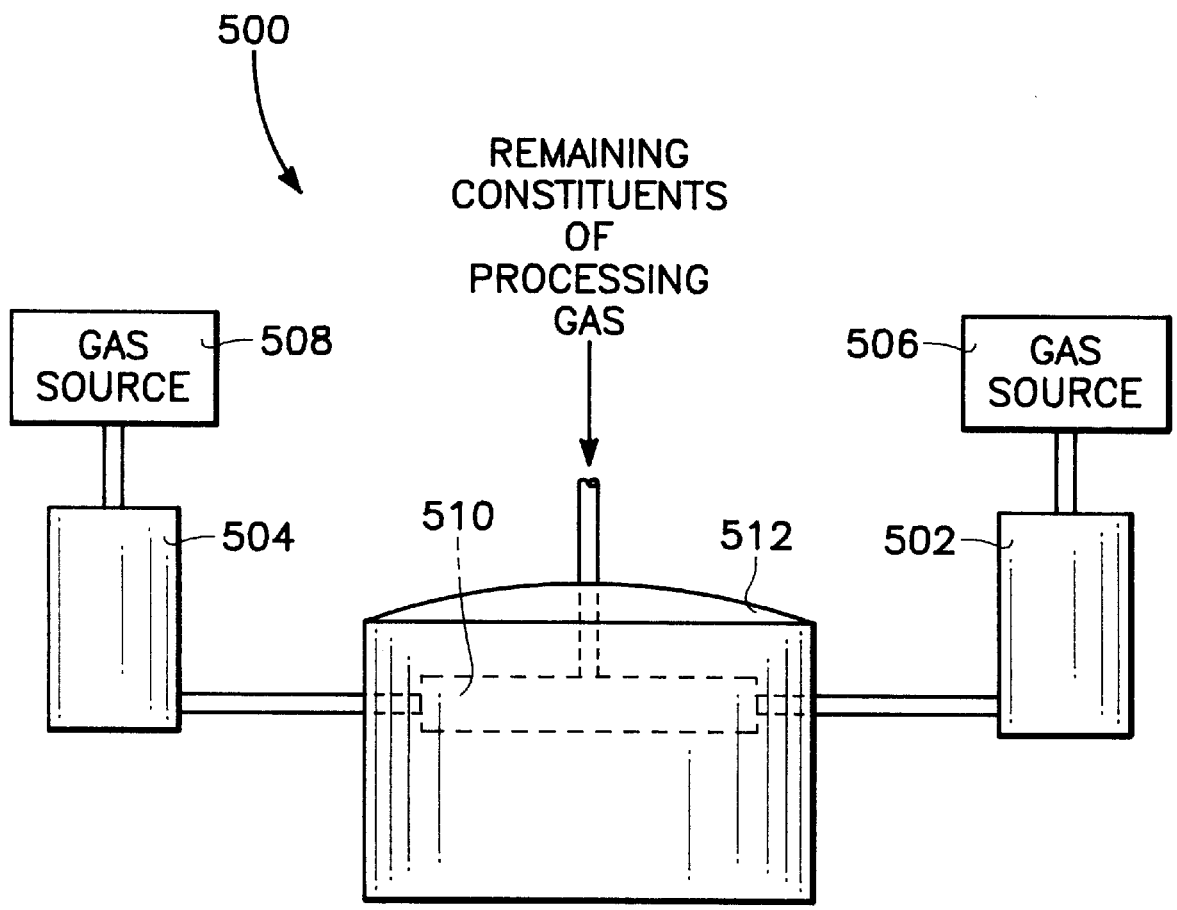
FIG. 5 is a schematic diagram of a plasma reactor incorporating multiple, separate scavenging chambers in accordance with the present invention.

While embodiments of the invention described thus far involve the use of a single scavenging chamber, this need not be the case. For example, in some etching processes it is desirable to increase the selectivity to more than one material wherein these materials require a different etchant species to be scavenged and/or different etching by-products to be loaded into the etchant gas. For example, the mask and some underlying workpiece layer materials can fall into this category. In cases where multiple scavenging materials cannot be combined in a single chamber without a detrimental effect on the scavenging process, two or more scavenging chambers employing different scavenging materials can be incorporated into the plasma reactor. In this configuration, the individual scavenging chambers are connected separately to the gas distribution apparatus 510 of the primary processing chamber 512 of the reactor 500, such as the two chamber 502, 504 depicted in FIG. 5. Both chambers could be connected to an etchant gas source 506, 508 containing the same etchant gas and used to scavenge the same etchant species. In this way, each separate flow of etchant gas entering the respective chambers 502, 504 would undergo the scavenging process. The scavenging material used in the chambers 502, 504 would, however, be such that different etch by-products are loaded into the respective etchant gas flows. If desired, the multiple scavenging chambers could also be connected to the same etchant gas source (not shown). Of course, this configuration could also be used to scavenge different etchant species from the etchant gas and load the gas with different etch by-products. Further, the gas sources 506, 508 could contain different etchant gases, rather than the same gas depending on the scavenging requirements of the process being performed in the primary processing chamber of the reactor.

Any of the previously-described scavenging chamber embodiments can also be modified to solve another problem typical of etch processing in a plasma reactor. It has been explained that process parameters promoting optimal etch conditions (such as a fast etch rate) within the primary processing chamber are not necessarily conducive to maximizing the desired selectivity. The same scenario also exist for other process factors as well. For example, inert gases such as argon (Ar) and helium (He) are often excited in the plasma of the primary processing chamber of a plasma reactor for advantageous effect. However, the process parameters that promote optimal etch performance in the primary chamber, such as the RF power level, are not always conducive to effectively excite these inert gas components of the processing gas. The problem can be resolved by employing a separate excitation chamber external to the primary processing chamber that excites gases at optimal conditions and feeds the modified gases into the primary chamber. An appropriate excitation chamber would be identical to any of the previously-described scavenging chamber embodiments, with the exception that the solid scavenging material source is not needed and can be eliminated. To this end, it is possible to modify an existing scavenging chamber to act as an excitation chamber by simply removing the scavenging material source. For example, in the embodiments using a liner as the scavenging source, it can be removed. In the capacitive discharge embodiment using internal electrodes made of a scavenging material, the electrodes can be replaced with ones made from a non-scavenging material. It is noted that as the scavenging liners and electrodes are designed for easy removal, converting a scavenging chamber to an excitation chamber without a scavenging source material can be readily accomplished. Further, if the ionization process is not adversely affected by the presence of a solid scavenging material source, then these structure could remain in place, thus making the excitation chamber physically identical to the scavenging chamber.

An excitation chamber can be employed alone, or in conjunction with other ionization and/or scavenging chambers, as desired. In regards to the later possibility, it can be readily imagined that a plasma reactor employing multiple scavenging chambers (such as was described previously) can be quite versatile. For example, if only one scavenging chamber is necessary, the other(s) can be idled. If only one excitation chamber is necessary, one of the scavenging chambers could be modified as needed, and again the other scavenging chambers would be idled. In the case where more than one scavenging process is required, the chambers can be employed as discussed previously. And finally, if more than one ionization processes or simultaneous scavenging and ionization processes are desired, the multiple scavenging chambers can be employed/modified as appropriate to accommodate this need.

While the invention has been described in detail by specific reference to preferred embodiments, it is understood that variations and modifications thereof may be made without departing from the true spirit and scope of the invention. For example, while the use of a solid scavenging material source is preferred and has been discussed throughout the foregoing description, it is possible that a gas containing the appropriate scavenging material could be introduced into the scavenging chamber instead. This scavenging gas would react with the etchant gas in the plasma formed within the scavenging chamber. The amount of gas introduced would be regulated to ensure the desired scavenging effect is achieved. Thus, the term scavenging source as used in connection with the present invention should be understood to include materials comprising a gas, a solid, or even a liquid, unless indicated otherwise.

What is claimed is:

1. A plasma reactor, comprising:
    a primary processing chamber having a workpiece supporter for holding a workpiece inside and a gas distribution apparatus capable of introducing a processing gas, which includes an etchant gas, into the primary processing chamber; and
    a scavenging chamber connected at an inlet thereof to an etchant gas source and connected at an outlet thereof to the gas distribution device of the primary processing chamber, said scavenging chamber comprising,
        a radiation applicator capable of irradiating the interior of the scavenging chamber and creating a plasma from etchant gas flowing through the scavenging chamber from the etchant gas source to the gas distribution apparatus of the primary processing chamber,
        an etchant species scavenging source disposed within the scavenging chamber and capable of interacting with the plasma to scavenge etchant species created by the dissociation of the etchant gas in the plasma and forming etch by-products comprised of substances from both the etchant species and the scavenging source.

2. The reactor of claim 1, wherein the radiation applicator uses one of (i) an inductive discharge, (ii) a capacitive discharge, (iii) a direct current (DC) discharge or (iv) a microwave discharge to irradiate the interior of the scavenging chamber and create the plasma therein.

3. The reactor of claim 1, wherein the etchant species scavenging source comprises a solid scavenging material and is as small as possible while still being capable of scavenging sufficient etchant species to create a desired concentration of etchant species and etchant by-products in a plasma formed within the primary processing chamber.

4. The reactor of claim 1, wherein the scavenging chamber further comprises a removable lid covering an access opening thereof, and wherein the etchant species scavenging source comprises a solid scavenging material and is sized so as to facilitate its being installed into or removed from the chamber through the access opening.

5. The reactor of claim 1, wherein the etchant species scavenging source comprises a solid scavenging material, and wherein the scavenging chamber further comprises a temperature control apparatus capable of controlling the temperature of the etchant species scavenging source so as to assist in ensuring the source is capable of scavenging sufficient etchant species to create a desired concentration of etchant species and etchant by-products in the plasma formed within the primary processing chamber.

6. The reactor of claim 1, wherein the workpiece includes a target material and the etchant species scavenging source comprises a scavenging material that scavenges the type of etchant species from the plasma formed within the scavenging chamber and produces the type of etch by-products that result in a lowering of the etch rate of the target material whenever the workpiece undergoes a plasma-assisted etching process in the primary processing chamber of the reactor.

7. The reactor of claim 2, wherein the radiation applicator comprising a coil antenna capable of radiating RF energy into the scavenging chamber by inductive coupling, thereby using an inductive discharge to create a plasma therein, said coil antenna being wound around the exterior of the scavenging chamber so as to surround a plasma generating region within the chamber.

8. The reactor of claim 7, wherein the etchant species scavenging source comprises a hollow liner comprised of a scavenging material, said liner being disposed adjacent to the inner walls of the scavenging chamber and surrounding the plasma generating region.

9. The reactor of claim 8, wherein the liner has an interior facing surface that interacts with a plasma formed in the scavenging chamber, said liner being sized so that its interior facing surface is just large enough, given a particular RF power input into the coil antenna and a particular flow rate of etchant gas through the scavenging chamber, to result in the scavenging of sufficient etchant species to create a desired concentration of etchant species and etchant by-products in the plasma.

10. The reactor of claim 8, wherein the liner comprises an electrically conductive material, and wherein said liner has a plurality of slots formed through its walls and spaced periodically around the circumference of the liner, the number and size of the slots being sufficient to ensure enough RF energy is transmittable into the plasma generating region of the scavenging chamber to ignite and maintain a plasma therein.

11. The reactor of claim 2, wherein the radiation applicator comprising a pair of electrodes capable of irradiating the interior of the scavenging chamber to create a plasma therein, said pair of electrodes facing each other across a plasma generating region of the chamber.

12. The reactor of claim 11, wherein the pair of electrodes are disposed inside the walls of scavenging chamber and are comprised of a scavenging material so as to collectively comprise the etchant species scavenging source of the chamber, and wherein said pair of electrodes are connected to a RF power source and capable of radiating RF energy into the scavenging chamber by capacitive coupling, thereby using a capacitive discharge to create the plasma within the scavenging chamber.

13. The reactor of claim 11, wherein the pair of electrodes are disposed inside the walls of scavenging chamber and are comprised of an electrically conductive scavenging material so as to collectively comprise the etchant species scavenging source of the chamber, and wherein said pair of electrodes are connected to a DC power source and capable of coupling energy into the scavenging chamber, thereby using a DC discharge to create the plasma within the scavenging chamber.

14. The reactor of claim 11, wherein the pair of electrodes are disposed outside the walls of scavenging chamber and the etchant species scavenging source comprises a hollow liner comprised of a dielectric or semiconductor scavenging material, said liner being disposed adjacent to the inner walls of the scavenging chamber and surrounding the plasma generating region.

15. The reactor of claim 14, wherein the liner has an interior facing surface that interacts with a plasma formed in the scavenging chamber, said liner being sized so that its interior facing surface is just large enough, given a particular RF power input into the pair of electrodes and a particular flow rate of etchant gas through the scavenging chamber, to result in the scavenging of sufficient etchant species to create a desired concentration of etchant species and etchant by-products in the plasma.

16. The reactor of claim 2, wherein the scavenging chamber further comprises an applicator tube through which the etchant gas flows on its way from the etchant gas source to the gas distribution apparatus of the primary processing chamber, and wherein the radiation applicator comprising a microwave source capable of irradiating the interior of an applicator tube, thereby using a microwave discharge to create a plasma therein.

17. The reactor of claim 16, wherein the etchant species scavenging source comprises a hollow liner comprised of a scavenging material, said liner being disposed between an outlet of the application tube and the outlet of the scavenging chamber such that the plasma formed of the etchant gas in the application tube exits the tube and passes through the liner on its way to the primary processing chamber.

18. The reactor of claim 17, wherein the liner has an interior facing surface that interacts with the plasma formed in the application tube, said liner being sized so that its interior facing surface is just large enough, given a particular power input into the microwave source and a particular flow rate of etchant gas through the liner, to result in the scavenging of sufficient etchant species to create a desired concentration of etchant species and etchant by-products in the plasma.

19. The reactor of claim 17, wherein the liner is located at a distance away from the applicator tube such that, given a particular power input into the microwave source and a particular flow rate of etchant gas through the liner, the scavenging of etchant species does not exceed a desired concentration thereof.

20. The reactor of claim 1, wherein the etchant species scavenging source comprises a gaseous scavenging material introduced into the scavenging chamber in a sufficient quantity to create a desired concentration of etchant species and etchant by-products in a plasma formed within the primary processing chamber.

21. The reactor of claim 1, further comprising at least one additional scavenging chamber, each additional scavenging chamber being connected at an inlet thereof to one of (i) the etchant gas source associated with the first scavenging chamber or (ii) a different etchant gas source, and connected at an outlet thereof to the gas distribution device of the primary processing chamber, each of said additional scavenging chambers comprising, a radiation applicator capable of irradiating the interior of the additional scavenging chamber and creating a plasma from etchant gas flowing through the additional scavenging chamber to the gas distribution apparatus of the primary processing chamber, an etchant species scavenging source disposed within the additional scavenging chamber and capable of interacting with the plasma to scavenge etchant species created by the dissociation of the etchant gas in the plasma and forming etch by-products comprised of substances from both the etchant species and the scavenging source.

22. The reactor of claim 1, further comprising an excitation chamber, each excitation chamber being connected at an inlet thereof to a gas source containing gases making up a part of the processing gas employed in the primary processing chamber and connected at an outlet thereof to the gas distribution device of the primary processing chamber, the excitation chamber comprising, a radiation applicator capable of irradiating the interior of the excitation chamber and creating a plasma from gas flowing through the excitation chamber to the gas distribution apparatus of the primary processing chamber.

\* \* \* \* \*